(12) United States Patent
Takaya

(10) Patent No.: US 7,273,760 B2
(45) Date of Patent: Sep. 25, 2007

(54) SEMICONDUCTOR DEVICE AND METHOD OF MANUFACTURING THE SAME

(75) Inventor: Koji Takaya, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 342 days.

(21) Appl. No.: 10/897,012

(22) Filed: Jul. 23, 2004

(65) Prior Publication Data

US 2005/0145985 A1    Jul. 7, 2005

(30) Foreign Application Priority Data

Dec. 26, 2003    (JP)    ............... 2003-431724

(51) Int. Cl.
*H01L 21/00*    (2006.01)
(52) U.S. Cl. .................... 438/3; 438/240
(58) Field of Classification Search ............ 438/3, 438/240, 353–356, 393–399, 253–256
See application file for complete search history.

(56) References Cited

U.S. PATENT DOCUMENTS

2004/0232468 A1* 11/2004 Solayappan et al. ........ 257/310

2005/0127395 A1* 6/2005 Saigoh et al. ............... 257/127

FOREIGN PATENT DOCUMENTS

JP    2003-252336 A    9/2003

* cited by examiner

*Primary Examiner*—H. Jey Tsai
(74) *Attorney, Agent, or Firm*—Volentine & Whitt, PLLC

(57) ABSTRACT

The present invention provides a method of manufacturing a semiconductor device that can inhibit deterioration of the ferroelectric film cased by hydrogen generated in a wiring layer. The method of manufacturing a semiconductor device includes steps of forming the ferroelectric capacitor by laminating first electrode 8, ferroelectric film 9, second electrode 10, covering the ferroelectric capacitor by insulating film 11, forming opening 13*d* that exposes the second electrode 10 on the insulating film 11, depositing or forming conductive hydrogen protective film 20, forming wiring layer 14 on the conductive hydrogen protective film 20, and patterning the wiring layer 14 and the conductive hydrogen protective layer 20 after forming the wiring layer 14.

14 Claims, 5 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same. More specifically, the present invention relates to a semiconductor device with a ferroelectric device and a method of manufacturing the same.

2. Background Information

A related example of a semiconductor device with a ferroelectric capacitor is described in Japanese Patent Publication JP-A-2002-252336, which is hereby incorporated by reference. In the semiconductor device, a ferroelectric capacitor is formed by laminating a lower electrode, a ferroelectric film, and an upper electrode, on a first insulating film in that order. The ferroelectric capacitor is covered with a second insulating film. An opening that exposes an upper electrode is formed in the second insulating film. In addition, a conductive barrier film and a conductive hydrogen barrier film are deposited or formed in that order, and patterned to have a region that includes an opening. Then a wiring layer is formed on the conductive hydrogen barrier film and the second insulating film. In the semiconductor device, the conductive barrier film and the conductive hydrogen barrier film are formed on the upper electrode exposed in the opening. Therefore, this structure prevents hydrogen and moisture generated in a later process from filtering through the upper electrode. As a result, deterioration of the ferroelectric film is prevented.

For example, in forming a wiring layer with wiring material including Al (aluminum), hydrogen is generated when moisture generated in a resist ashing process after the patterning of wiring chemically reacts with wiring material (Al) inside the wiring layer. To prevent the hydrogen generated in the wiring layer from reaching the upper electrode, the conductive barrier film and the conductive hydrogen barrier film are formed at a location between the upper electrode and wiring layer in the manufacturing process described above. However, in the manufacturing process, the wiring layer is formed after patterning the conductive barrier film and the conductive hydrogen barrier film, and a part of the wiring layer is directly formed on the second insulating film. In this structure, there is a possibility that hydrogen generated in the wiring layer filters through the second insulating film, enters the upper electrode and the ferroelectric film, and deteriorates the ferroelectric film.

In view of the above, there exists a need for an improved semiconductor and a method of manufacturing the semiconductor device, which can inhibit deterioration of the ferroelectric film caused by hydrogen generated from the wiring layer. This invention addresses this need in the related art as well as other needs, which will become apparent to those skilled in the art from this disclosure.

SUMMARY OF THE INVENTION

A method of manufacturing a semiconductor device according to a first aspect of the present invention includes forming a ferroelectric capacitor by laminating a first electrode, a ferroelectric film, and a second electrode in that order, covering the ferroelectric capacitor with an insulating film, forming a first opening that exposes a second electrode in the insulating film, depositing or forming a conductive hydrogen protective film on the insulating film and on the inner wall of the first opening, depositing or forming a wiring layer on a conductive hydrogen protective film, and patterning the wiring layer and the conductive hydrogen protective film after forming the wiring layer.

In the method of manufacturing a semiconductor device of the present invention, a conductive hydrogen protective film is provided in an under layer of the wiring layer to pattern the wiring layer and the conductive hydrogen protective film after forming the wiring layer on the conductive hydrogen protective film, and prior to patterning the conductive hydrogen protective film. In this structure, even if moisture generated in a later process initiates a chemical reaction in the wiring layer and hydrogen is generated, it is possible to block hydrogen intrusion into the second electrode from the wiring layer and into the insulting film from the wiring layer by the conductive hydrogen protective film. Further, hydrogen intrusion into the ferroelectric film through the second electrode and the insulating film is also inhibited. As a result, deterioration of the ferroelectric film by hydrogen generated in the wiring layer can be inhibited or avoided entirely.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Figure 3:
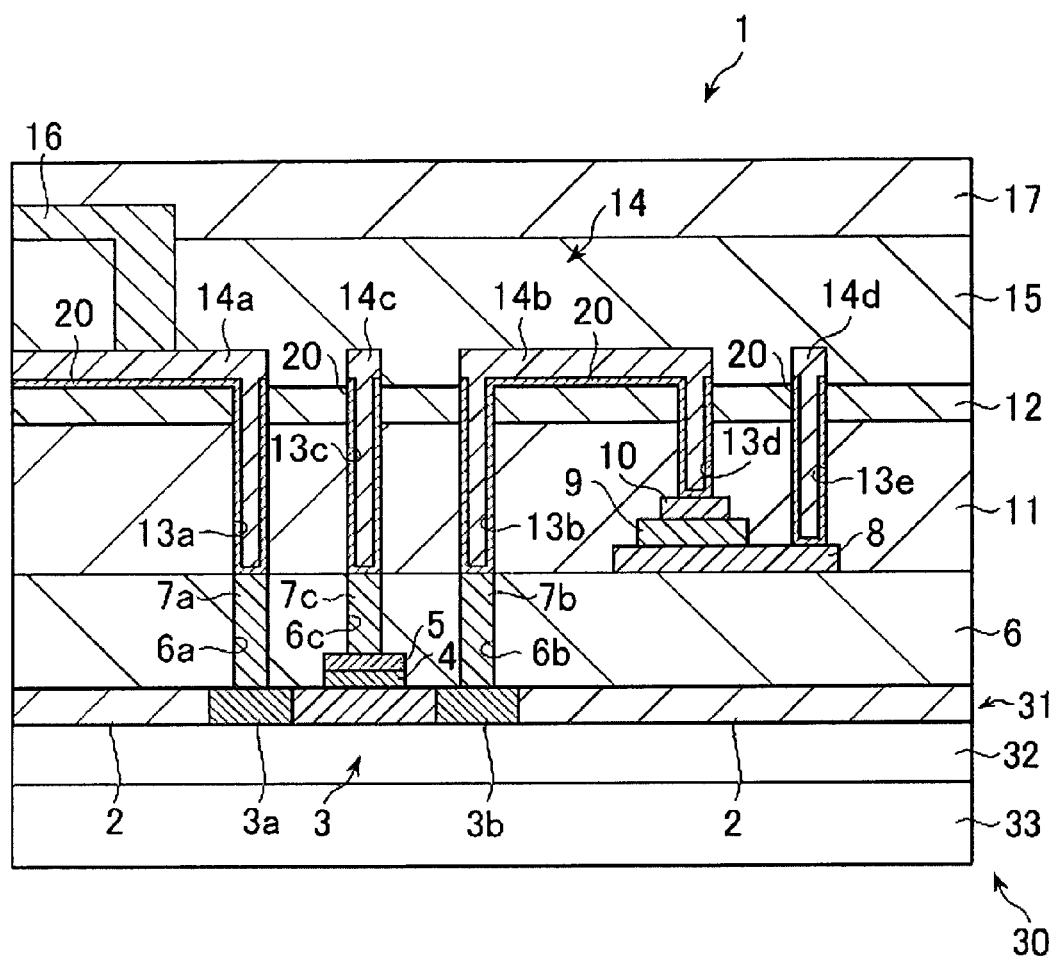
FIG. 3 is a view of a cross-section diagram even further illustrating the method of manufacturing a semiconductor device in accordance with the first embodiment of the present invention.

FIG. 3 is a cross-sectional diagrammatical view of a semiconductor device 1 in accordance with a first preferred embodiment of the present invention. The semiconductor device 1 is a ferroelectric memory device with a planer type ferroelectric capacitor. The semiconductor device 1 has a transistor and a ferroelectric capacitor. The transistor is formed in an active region 3 separated by a device isolation insulating-film 2 in a semiconductor substrate or SOI (Silicon on Insulator) substrate 30. The SOI substrate 30 includes a silicon layer 31 in which the device isolation insulating-film 2 is formed, an insulating layer (e.g. an oxide layer) 32, and a support substrate 33. The support substrate 33 is preferably made of silicon. The ferroelectric capacitor is formed on an interlayer insulating film (first insulating layer) 6 covering the transistor. The transistor is composed of source-drain regions 3a and 3b, a gate-insulating film 4, and a gate electrode 5. The source-drain regions 3a and 3b are formed in the active region 3. The gate-insulating film 4 is formed on a portion of the active region 3 located between the source drain regions 3a and 3b. The gate-electrode 5 is preferably formed on the gate-insulating film 4. The source-drain region 3a and 3b respectively correspond to a first end of a main current path and a second end of the main current path, and the gate-electrode 5 corresponds to a control electrode. The interlayer insulating film 6 is formed to cover the transistor. Openings (first and second openings) 6a and 6b are formed to expose respectively the source-drain regions 3a and 3b. An opening (third opening) 6c is formed to expose the gate electrode 5. In addition, contact plugs 7a, 7b, and 7c are composed of conductive materials, and are respectively buried or filled in the openings 6a, 6b, and 6c. The ferroelectric capacitor is formed by laminating a lower electrode (first electrode) 8, a ferroelectric film 9, and an upper electrode (second electrode) 10 in that order. The lower electrode 8 is formed to project outward from the ferroelectric film 9 and the upper electrode 10 to obtain conduction from above. The ferroelectric capacitor is covered by an interlayer insulating film (second insulating layer) 11. Further, a moisture diffusion protective film 12 is formed on the entire upper surface of the interlayer insulating film 11. That is, the moisture diffusion protective film 12 covers the ferroelectric capacitor via the interlayer insulating film 11. Openings (fourth, fifth, sixth, seventh, and eighth openings) 13a, 13b, 13c, 13d, and 13e are formed in the moisture diffusion protective film 12 and the interlayer insulating film 11. The openings 13d and 13e could also be respectively viewed as first openings with respect to the upper electrode 10 and the lower electrode 8. The openings 13d and 13e could also respectively be viewed as second openings with respect to the lower electrode 8 and the upper electrode 10. A first wiring layer (1M) 14 is formed on the moisture diffusion protective film 12 and on the inner surface of the openings 13a to 13e via a conductive hydrogen protective film 20. The hydrogen protective film 20 is patterned in the same shape as the first wiring layer 14. The hydrogen protective film can be any one of titanium, titanium aluminum alloy, titanium aluminum nitride, aluminum nitride, and iridium oxide. That is, the first wiring layer 14 is formed only on the conductive hydrogen protective film 20. The first wiring layer 14 has an electrical connection with the transistor and the ferroelectric capacitor via the conductive hydrogen protective film 20 formed inside the openings 13a to 13e, respectively.

The first wiring layer 14 includes wirings 14a, 14b, 14c, and 14d. In the opening 13a, the wiring 14a has an electrical connection with the source-drain region 3a via the conductive hydrogen protective film 20 and the contact plug 7a. Further, the wiring 14a is connected with a bit-line that is not shown in the figures. In the opening 13b, the wiring 14b has an electrical connection with the source-drain region 3b of the transistor via the conductive hydrogen protective film 20 and the contact plug 7b. Furthermore, in the opening 13d, the wiring 14b also has an electrical connection with the upper electrode 10 of the ferroelectric capacitor via the conductive hydrogen protective film 20. Thus, the wiring 14b electrically connects the source-drain region 3b to the upper electrode 10. In the opening 13c, the wiring 14c has an electrical connection with the gate-electrode 5 via the conductive hydrogen protective film 20 and the contact plug 7c. In the opening 13e, the wiring 14d has an electrical connection with the lower electrode 8 of the ferroelectric capacitor via the conductive hydrogen protective film 20, and is connected with a plate line that is not shown in the figure. In addition, the interlayer insulating film (third insulating layer) 15 is formed to cover the first wiring layer 14. A second wiring layer (2M) 16, which has an electrical connection with the first wiring layer 14 through an opening, is formed on the interlayer insulating film 15. Moreover, the second wiring layer 16 is covered with the protection film 17.

Method of Manufacturing

Figure 1:
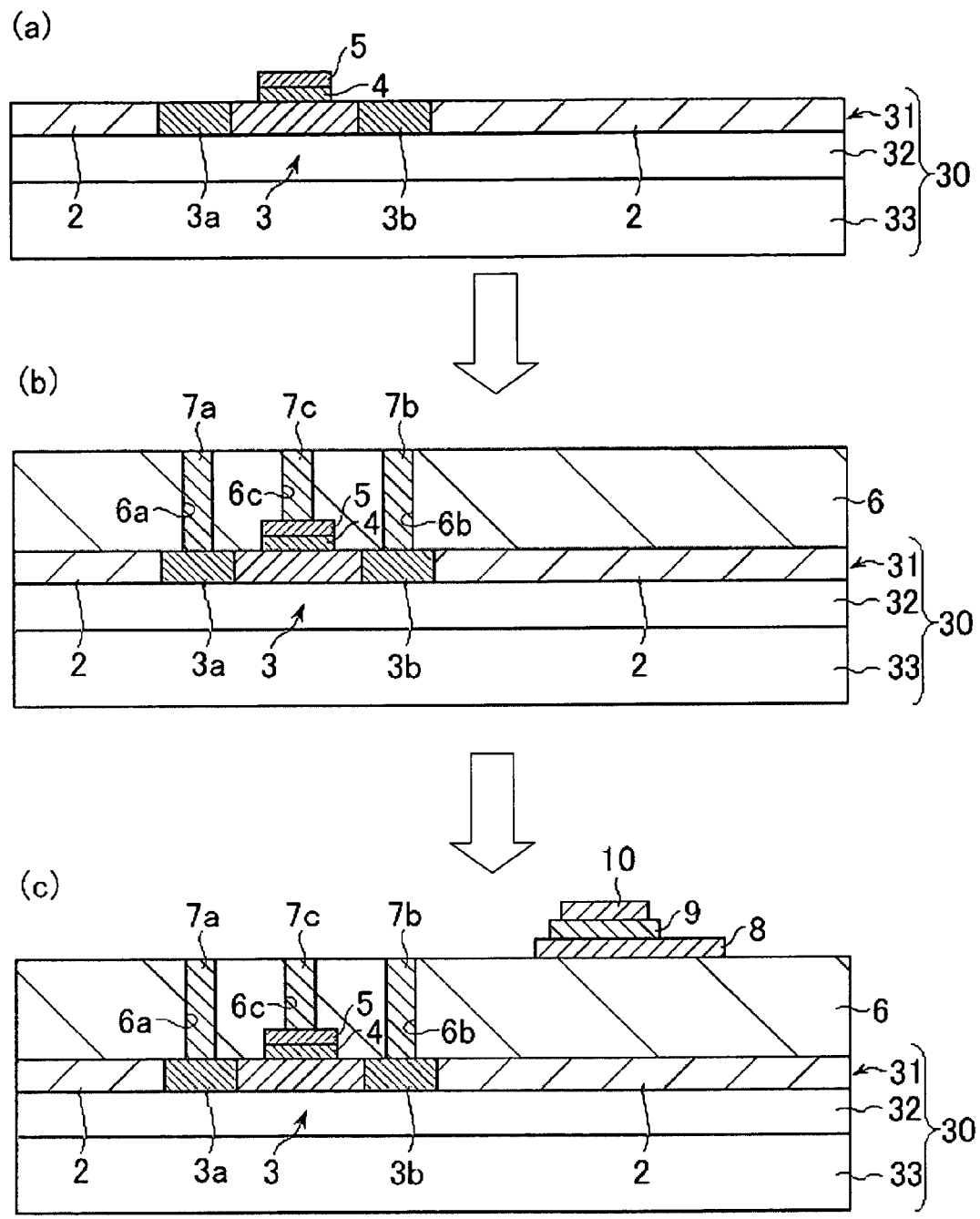
FIG. 1 is a view of cross-section diagrams illustrating a method of manufacturing a semiconductor device in accordance with a first embodiment of the present invention.
Figure 2:
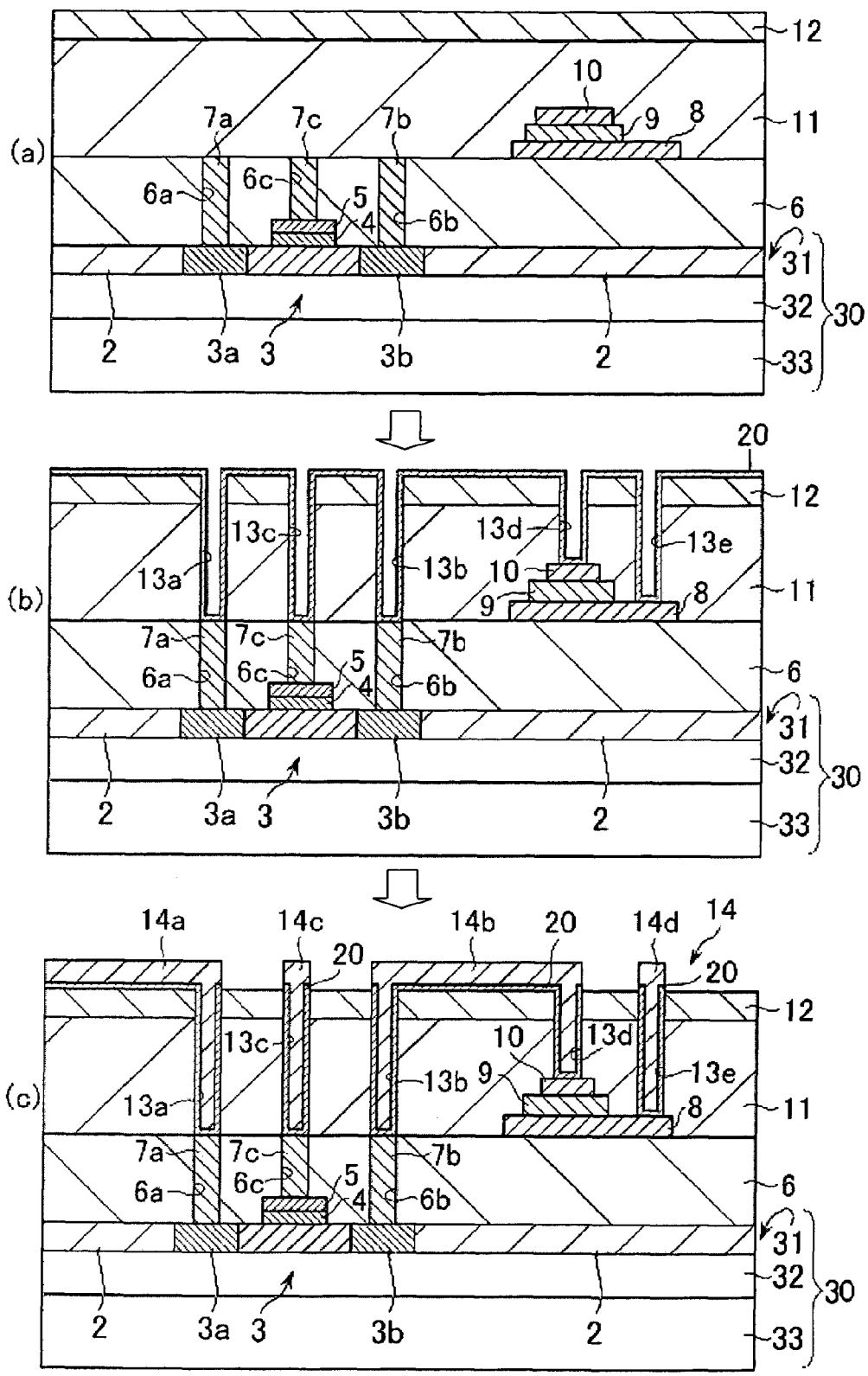
FIG. 2 is a view of cross-section diagrams further illustrating the method of manufacturing a semiconductor device in accordance with the first embodiment of the present invention.

A method of manufacturing the semiconductor device 1 in accordance with the present embodiment is described with reference to FIGS. 1 to 3.

For example, as shown in FIG. 1(a), the device isolation insulating-film 2 that is made of an oxide film is formed on a semiconductor layer of a SOI substrate. In addition, to control the threshold voltage of the transistor, active regions 3a and 3b are formed by selective ion implantation and activation for N-type or P-type impurities. Then, the gate-insulating film 4 and the gate electrode 5 are patterned by patterning them with photolithoetching after laminating an insulating film (e.g., oxide film) and electrode materials (e.g., polycrystalline silicon) in this order. Sequentially, the source-drain regions 3a and 3b are formed in the active region 3a by ion implantation of P-type or N-type impurities into the corresponding area of the active region 3.

Next, as shown in FIG. 1(b), the interlayer insulating film 6 is formed by depositing an oxide film or a nitride film by a CVD method. Then, the openings 6a, 6b, and 6c that respectively expose the source-drain regions 3a and 3b, and the gate-electrode 5 respectively are formed in the interlayer insulating film 6 by photolithoetching. In addition, tungsten (W) is buried or filled in openings 6a, 6b, and 6c by a CVD method to form the contact plugs 7a, 7b, and 7c. The contact plugs 7a and 7b are respectively connected with the source-drain regions 3a and 3b, and the contact plug 7c is connected to the gate-electrode 5.

Next, as shown in FIG. 1(c), the lower electrode 8, the ferroelectric film 9, and the upper electrode 10 are formed by laminating a Pt film, a SBT ($SrBiTa_2O_9$) film, and a Pt film on the interlayer insulating film 6 in that order, and patterning them by photolithoetching. The patterning is conducted such that the lower electrode 8 is the longest of the three and the upper electrode 10 is the shortest. In this process, the ferroelectric film 9 can be $PZT(PbZr_xO_{1-x})$, $SBTN((SrBi_2(Ta, Nb)_2O_9)$, or $BLT((Bi, La)_4Ti_3O_{12})$. In addition, the lower electrode 8 and the upper electrode 10 can be made of a material that does not contain Pt, such as Iridium (Ir) or an Iridium alloy.

Next, as shown in FIG. 2(a), the interlayer insulating film 11 is formed by depositing an oxide film or a nitride film by a CVD method on the interlayer insulating film 6. Sequentially, the moisture diffusion protective film 12 is formed by depositing silicon nitride on the interlayer insulating film 11 by a reactive sputtering method. In this process, the reactive sputter is conducted in a nitride atmosphere with a target of silicon (Si), while two-staged RF power is applied. For example, the RF power is set as 1 kW in the early stage, and set as 1.6 kW in the next stage. The value of the RF power is determined so that the moisture diffusion protective film 12 sufficiently works after its formation. In addition, the gate-electrode 5 and the contact plug 7c are insulated from the moisture diffusion protective film 12 by the interlayer insulating layer 11 during the sputter process because the interlayer insulating film 11 is formed before depositing the moisture diffusion protective film 12. Therefore, accumulation of charges in the gate-electrode 5 can be inhibited or avoided entirely, even if high sputter power is applied and charged particles in plasma electrize charges in the moisture diffusion protective film in the sputter process to form the moisture diffusion protective film 12. As a result, charging damage to the transistor can be inhibited or avoided entirely. In addition, RF power is set as 1 kW in the first stage of deposition, and is increased to 1.6 kW in the next stage, because layers below the interlayer insulating film 11 can be damaged by high sputter power in the early stage of depositing the moisture diffusion protective film 12. The moisture diffusion protective film 12 is preferably made of $Si_3N_4$ or SiON because of their anticorrosion properties against water and heat resistance in various manufacturing processes.

Next, as shown in FIG. 2(b), the openings 13a to 13e, which respectively expose contact plugs 7a through 7c, the upper electrode 10, and the lower electrode 8, are formed by photolithoeching the moisture diffusion protective film 12 and the interlayer insulating film 11. Then, the conductive hydrogen protective film 20 is formed by depositing titanium aluminum nitride (AlTiN) on the moisture diffusion protective film 12 and on each inner wall (side and bottom surface) of the openings 13a to 13e by a reactive sputtering method. The reactive sputter is conducted at 1 kW DC power in the nitriding atmosphere with a target of aluminum titanium (AlTi). In addition, the conductive hydrogen protective film 20 can be made of a low hydrogen permeability conductive material, such as titanium, aluminum titanium alloy, or aluminum nitride.

Next, as shown in FIG. 2(c), the first wiring layer 14 composed of wiring 14a to 14d is formed by depositing an aluminum alloy on the conductive hydrogen protective film 20 by a sputtering method, and patterning the aluminum alloy layer and the conductive hydrogen protective film 20 to have the same or similar shape. In other words, the conductive hydrogen protective film 20 is configured to be interposed by the first wiring layer 14 and the moisture diffusion protective film 12, the interlayer insulating film 11, the contact plugs 7a, 7b, and 7c, the upper electrode 10, and the lower electrode 8.

In addition, as shown in FIG. 3, the second wiring layer 16 is formed according to the following steps. The interlayer insulating film 15 is formed by depositing an oxide film or a nitride film on the entire upper surface of the first wiring layer 14 by a CVD method. Then, an opening that exposes the first wiring layer 14 is formed in the interlayer insulating film 15 by photolithoetching. Sequentially, an aluminum alloy is deposited by a sputter method, and the aluminum alloy compound film is photolithoetched, and the second wiring layer 16 is formed. Furthermore, the protection film 17 covering the second wiring layer 16 is formed.

In the method of manufacturing a semiconductor device in accordance with the present embodiment, the conductive hydrogen protective film 20 in a lower layer of the first wiring layer 14 is formed, because the first wiring layer 14 and the conductive hydrogen protective film 20 are patterned to have the same shape, after depositing the wiring layer 14 on the conductive hydrogen protective film 20 and prior to patterning the conductive hydrogen protective film 20. In this structure, even if hydrogen is generated by a chemical reaction of moisture generated in a later process for the first wiring layer 14, hydrogen intrusion into the lower electrode 8 and the upper electrode 10 from the first wiring layer 14 is prevented by the conductive hydrogen protective film 20. Thus, hydrogen intrusion into the ferroelectric film 9 through the lower electrode 8 and the upper electrode 10 can be inhibited or avoided entirely. In addition, hydrogen intrusion into the diffusion protective film 12 and the interlayer insulating film 11 from the first wiring layer 14 can be blocked at the conductive hydrogen protective film 20, and hydrogen intrusion into the ferroelectric film 9 through the moisture diffusion protective film 12 and the interlayer insulating film 11 can be inhibited. As a result, deterioration of the ferroelectric film 9 by hydrogen generated in the first wiring layer 14 can be effectively inhibited.

In addition, the first wiring layer 14 is formed in a separate process from the moisture diffusion protective film 12, and the gate-electrode 5 and the contact plug 7c are insulated from the moisture diffusion protective film 12 by the interlayer insulating film 11, as shown in FIG. 2(a). Therefore, even if, in the sputter process to form the moisture diffusion protective film 12, high sputter power is applied and charged particles in plasma electrize charges in the moisture diffusion protective film 12, accumulation of charges in the gate-electrode 5 can be inhibited or avoided entirely, because the gate-electrode 5 is insulated from the moisture diffusion protective film 12 by the interlayer insulation film 11. As a result, charging damage to the transistor can be inhibited or avoided entirely.

Furthermore, moisture and hydrogen, which are generated in a later process after the first wiring layer 14 is formed, can be prevented from intruding into the ferroelectric capacitor, because the moisture diffusion protective film 12 and the conductive hydrogen protective film 20 are formed before the first wiring layer 14 is formed. Due to this structure, moisture and hydrogen generated in a process of forming the first wiring layer 14 can be blocked from entering the ferroelectric capacitor. That is, as shown in FIGS. 2(b) and 2(c), in forming the first wiring layer 14, especially, in a process of ashing resist after etching the first wiring layer 14, moisture generated in a resist ashing process is blocked by the moisture diffusion protective film 12 because the ferroelectric capacitor is already covered with the moisture diffusion protective film 12 and the conductive hydrogen protective film 20. In addition, hydrogen generated by a chemical reaction of moisture in the first wiring layer 14 is blocked by the conductive hydrogen protective film 20. As a result, intrusion of moisture and hydrogen into the ferroelectric capacitor is inhibited, and property deterioration of the ferroelectric capacitor can be inhibited or avoided entirely.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

SECOND EMBODIMENT

A second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

Figure 5:
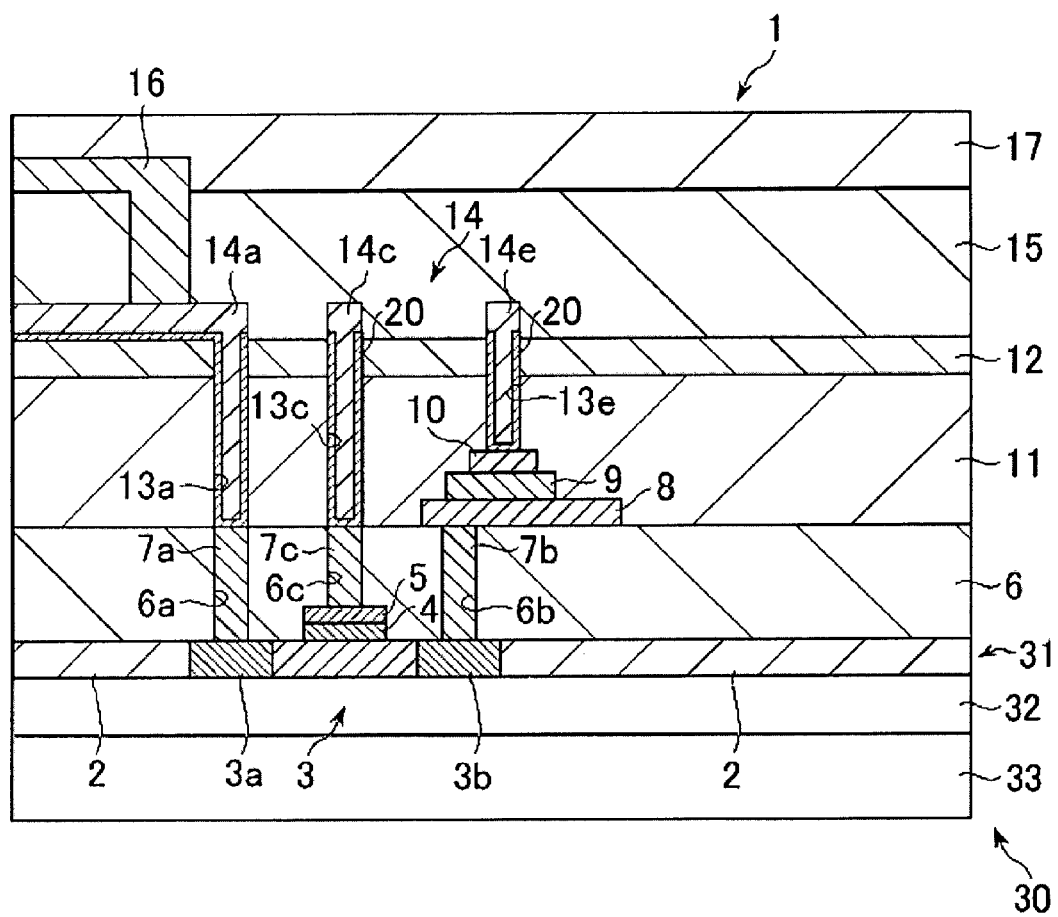
FIG. 5 is a view of a cross-section diagram further illustrating the method of manufacturing a semiconductor device in accordance with the second embodiment of the present invention.

FIG. 5 is a cross-sectional diagrammatical view of a semiconductor device 1 in accordance with a second preferred embodiment of the present invention. A semiconductor device 1 of the present embodiment is a ferroelectric memory device with a stack type ferroelectric capacitor. The present embodiment is different from the first embodiment mainly in that lower electrode 8 of the ferroelectric capacitor is formed on the contact plug 7b in the interlayer insulating film 6. That is, the lower electrode 8 of the ferroelectric capacitor has a direct electrical connection with the contact plug 7b without the intervention of the first wiring layer 14.

Figure 4:
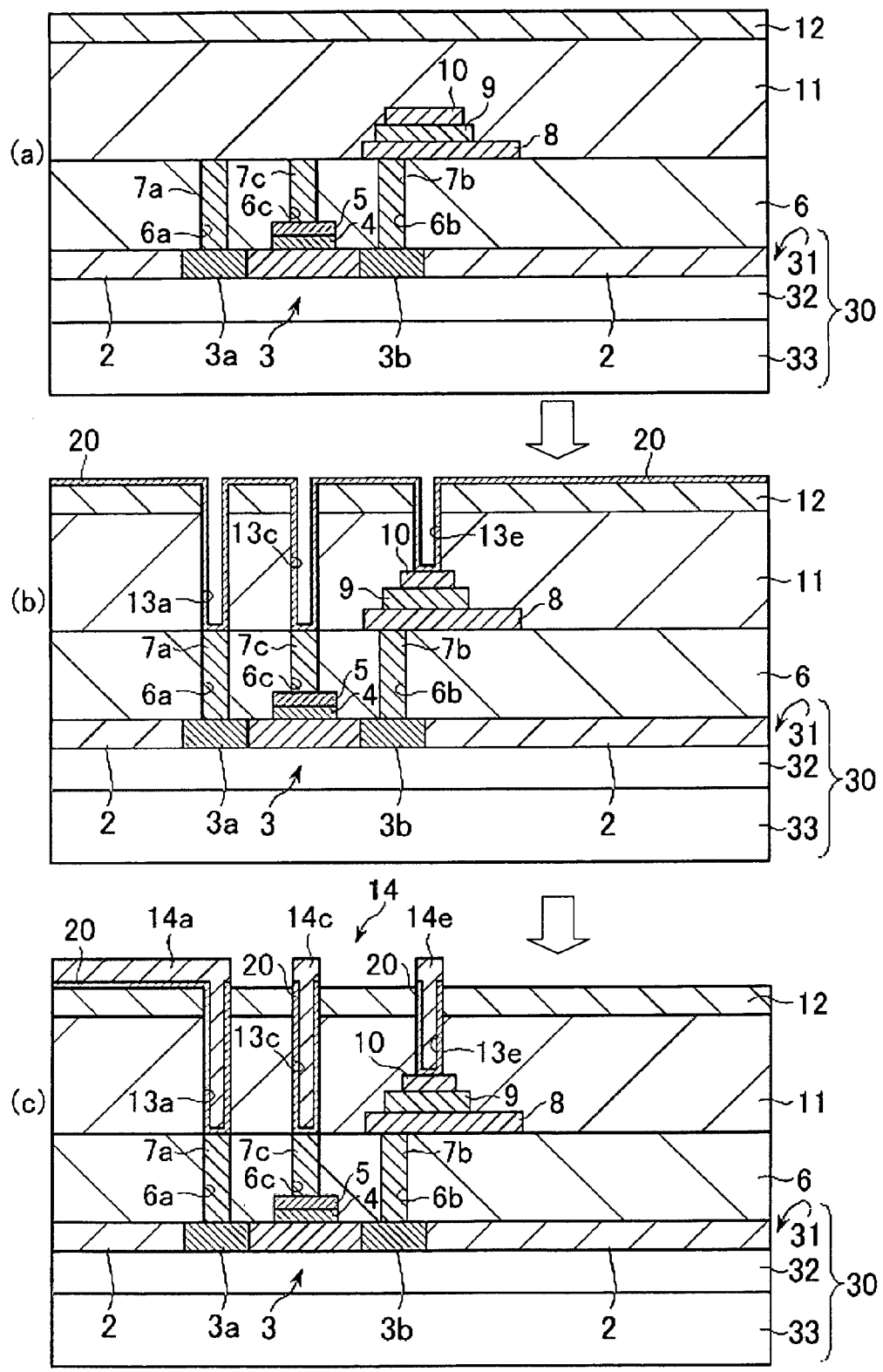
FIG. 4 is a view of cross-section diagrams illustrating a method of manufacturing a semiconductor device in accordance with a second embodiment of the present invention.

The following is an explanation of the manufacturing the semiconductor device 1 with reference to FIGS. 4 and 5. After following the method of the previous embodiment to the process illustrated in FIG. 1(b), the lower electrode 8, the ferroelectric film 9, and the upper electrode 10 are formed by laminating a Pt film, a SBT($SrBiTa_2O_9$) film, and a Pt film on the contact plug 7b in that order, and patterning them by photolothoetching so that the lower electrode 8 remains on contact plug 7b (see FIG. 4(a)). In addition, the interlayer insulating film 11 is formed by depositing an oxide film or a nitride film on the interlayer insulating film 6 by a CVD method. Sequentially, the moisture diffusion protective film 12 is formed by depositing silicon nitride on the interlayer insulating film 11 by a reactive sputtering method.

Next, as shown in FIG. 4(b), the openings 13a, 13b, and 13e that respectively expose contact plugs 7a and 7c, and the upper electrode 10 are formed by photolithoetching the moisture diffusion protective film 12 and the interlayer insulating film 11. The opening 13e could be viewed as a first opening with respect to the upper electrode 10. In addition, the conductive hydrogen protective film 20 is formed by depositing AlTiN by a reactive sputtering method.

In the present embodiment, an opening that exposes the contact plug 7b and an opening that exposes the lower electrode 8 are not required to be formed because the contact plug 7b and the lower electrode 8 are directly connected.

Next, as shown in FIG. 4(c), the first wiring layer 14 composed of the wirings 14a, 14b, and 14e is formed by depositing an aluminum compound by a sputtering method, and patterning the aluminum compound layer and the conductive hydrogen protective film 20 in the same shape with photolithoetching. In other words, the conductive hydrogen protective film 20 is configured to be interposed by the first wiring layer 14 and the moisture diffusion protective film 12, the interlayer insulating film 11, the contact plugs 7a and 7c, and the upper electrode 10. In the present embodiment, a wiring that connects to the contact plug 7b and a wiring that connects to the lower electrode 8 are not required to be formed because the contact plug 7b and the lower electrode 8 are directly connected.

In addition, as shown in FIG. 5, the second wiring layer 16 is formed according to the following process. The interlayer insulating film 15 is formed by depositing an oxide film or a nitride film on the first wiring layer 14 by a CVD method, and an opening that exposes the first wiring layer 14 is formed in the interlayer insulating film 15 by photolithoetching. Then, an aluminum compound is deposited by a sputter method. The aluminum compound film is photolithoetched, and the second wiring layer 16 is formed. Finally, the protection film 17 covering the second wiring layer 16 is formed.

Hydrogen intrusion into the upper electrode 10 from the first wiring layer 14 can be blocked by the conductive hydrogen protective film 20 because the conductive hydrogen protective film 20 is located on the lower layer of the first wiring layer 14 in the present embodiment as well as in the first embodiment. Further, charging damage to the transistor can be inhibited, even if high sputter power is applied in a sputter process to form the moisture diffusion protective film 12 and charged particles in plasma electrize charges in moisture diffusion protective film 12 for the same reasons outlined in the first embodiment. In addition, property deterioration of the ferroelectric capacitor by moisture and hydrogen generated in resist ashing process in forming the first wiring layer 14 can be inhibited or avoided entirely for the same reasons outlined in the first embodiment.

Terms that are expressed as "means-plus function" in the claims should include any structure that can be utilized to carry out the function of that part of the present invention.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2003-431724. The entire disclosure of Japanese Patent Application No. No. 2003-431724 is incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A method of manufacturing a semiconductor device comprising:
    forming a ferroelectric capacitor by laminating a first electrode, a ferroelectric film, and a second electrode;
    covering said ferroelectric capacitor by an insulating film;
    forming a moisture diffusion protective film on said insulating film by forming a first portion of said moisture diffusion protective film at a first power and a second portion of said moisture diffusion protective film at a second power, said first power higher than said second power;
    forming a first opening to expose said second electrode in said moisture diffusion protective film and said insulating layer;
    forming a conductive hydrogen protective film on said insulating layer and on an inner wall of said first opening;
    forming a wiring layer on said conductive hydrogen protective layer; and patterning said wiring layer and said conductive hydrogen protective film after forming said wiring layer.

2. The method of manufacturing a semiconductor device according to claim 1, wherein said conductive hydrogen protective film is selected from the group consisting of titanium, titanium aluminum alloy, titanium aluminum nitride, aluminum nitride, and iridium oxide.

3. The method of manufacturing a semiconductor device according to claim 1, wherein a second opening that exposes said first electrode is formed in said insulating layer when forming said first opening, and said conductive hydrogen protective film is formed on an inner wall of said second opening when forming said conductive hydrogen protective film.

4. The method of manufacturing a semiconductor device according to claim 1, wherein said moisture diffusion protective film is formed by reactive sputtering, said first power is a first RF power, and said second power is a second RF power.

5. The method of manufacturing a semiconductor device according to claim 1, wherein said moisture diffusion protective film is formed from a heat resistant material.

6. The method of manufacturing a semiconductor device according to claim 5, wherein the heat resistant material is selected from the group consisting of $Si_3N_4$ and SiON.

7. A method of manufacturing a semiconductor device comprising:

forming a transistor having a first end of a main current path, a second end of said main current path, and a control electrode;

covering said transistor by a first insulating layer;

forming first, second, and third openings to expose respectively said first end of main current path, said second end of main current path, and said control electrode;

burying respectively first, second, and third conductive materials in said first, second, and third openings;

forming a ferroelectric capacitor by laminating a first electrode, a ferroelectric film, and a second electrode on said first insulating layer, said first electrode being formed on said third conductive material;

covering said ferroelectric capacitor with a second insulating layer;

forming fourth, fifth, sixth openings to expose respectively said first and second conductive materials, said second electrode in said second insulating layer;

forming a conductive hydrogen protective film on said second insulating layer and on each inner wall of said fourth to sixth openings;

forming a wiring layer on said conductive hydrogen protective film; and patterning said wiring layer and said conductive hydrogen protective film after forming said wiring layer.

8. The method of manufacturing a semiconductor device according to claim 7, further comprising:

forming a moisture diffusion protective film on said second insulating layer; and forming fourth, fifth, sixth openings in said second insulating layer and said moisture diffusion protective layer.

9. The method of manufacturing a semiconductor device according to claim 7, wherein said conductive hydrogen protective film is selected from the group consisting of titanium, titanium aluminum alloy, titanium aluminum nitride, aluminum nitride, and iridium oxide.

10. The method of manufacturing a semiconductor device according to claim 7, wherein said conductive hydrogen protective film is titanium aluminum nitride.

11. The method of manufacturing a semiconductor device according to claim 7, further comprising forming a moisture diffusion protective film on said insulating film by forming a first portion of said moisture diffusion protective film at a first power and a second portion of said moisture diffusion protective film at a second power, said first power higher than said second power.

12. The method of manufacturing a semiconductor device according to claim 11, wherein said moisture diffusion protective film is formed by reactive sputtering, said first power is a first RF power, and said second power is a second RF power.

13. The method of manufacturing a semiconductor device according to claim 11, wherein said moisture diffusion protective film is formed from a heat resistance material.

14. The method of manufacturing a semiconductor device according to claim 13, wherein the heat resistance material is selected from the group consisting of $Si_3N_4$ and SiON.

* * * * *